(12) United States Patent
Lim et al.

(10) Patent No.: US 6,613,648 B1
(45) Date of Patent: Sep. 2, 2003

(54) SHALLOW TRENCH ISOLATION USING TEOS CAP AND POLYSILICON PULLBACK

(75) Inventors: Seng-Keong Victor Lim, Singapore (SG); Feng Chen, Singapore (SG); Kong Hean Lee, Singapore (SG); Wang Ling Goh, Singapore (SG)

(73) Assignee: Chartered Semiconductor Manufacturing Limited, Singapore (SG)

( * ) Notice: Subject to any disclaimer, the term of this patent is extended or adjusted under 35 U.S.C. 154(b) by 0 days.

(21) Appl. No.: 10/197,354

(22) Filed: Jul. 15, 2002

(51) Int. Cl.[7] .............................................. H01L 21/762
(52) U.S. Cl. ....................................... 438/424; 438/692
(58) Field of Search ................................ 438/430, 424, 438/692, FOR 227

(56) References Cited

U.S. PATENT DOCUMENTS

| | | | | |
|---|---|---|---|---|
| 5,506,168 A | * | 4/1996 | Morita et al. | 438/424 |
| 5,677,233 A | * | 10/1997 | Abiko | 438/424 |
| 5,712,185 A | * | 1/1998 | Tsai et al. | 438/424 |
| 5,834,358 A | * | 11/1998 | Pan et al. | 438/424 |
| 5,960,297 A | * | 9/1999 | Saki | 438/424 |
| 6,121,110 A | * | 9/2000 | Hong et al. | 438/400 |
| 6,121,113 A | * | 9/2000 | Takatsuka et al. | 438/424 |
| 6,153,478 A | * | 11/2000 | Lin et al. | 438/296 |
| 6,159,823 A | * | 12/2000 | Song et al. | 438/437 |
| 6,355,538 B1 | * | 3/2002 | Tseng | 438/424 |
| 6,368,973 B1 | * | 4/2002 | Tseng | 438/692 |

* cited by examiner

Primary Examiner—George Fourson
(74) Attorney, Agent, or Firm—Wagner, Murabito & Hao LLP

(57) ABSTRACT

A method and apparatus for shallow trench isolation. First, a layer of silicon nitride (SiN) is deposited over a semiconductor substrate. A layer of polysilicon is then deposited over the silicon nitride layer. A layer of tetraethylorthosilicate (TEOS) is deposited over the polysilicon layer. Mask and etch steps are performed to form an opening that extends through the TEOS layer and through the polysilicon layer. An etch step is then performed to etch the exposed side surfaces of the polysilicon layer. Thereby, the exposed side surfaces of the polysilicon layer are moved laterally. An etch step is then performed so as to form a trench that extends into the semiconductor substrate. Dielectric material is deposited such that the dielectric material fills the trench and fills the opening that extends through the polysilicon layer and the silicon nitride layer. The substrate is then polished using a chemical mechanical polishing process. The chemical mechanical polishing process removes the polysilicon layer and forms a plug of dielectric material that fills the trench. The plug of dielectric material has a top surface that is planar with respect to the top of the silicon nitride layer.

15 Claims, 11 Drawing Sheets

SHALLOW TRENCH ISOLATION USING TEOS CAP AND POLYSILICON PULLBACK

BACKGROUND OF THE INVENTION

1. Field of the Invention

The present invention relates to the field of semiconductor devices. More particularly, the present invention relates to a method and apparatus for preventing dishing that results from chemical mechanical polishing of shallow trench isolation structures.

2. Related Art

As semiconductor devices continue to be reduced in size, Complimentary Metal Oxide Semiconductor (CMOS) device fabrication processes have evolved that use shallow trench isolation structures for isolating device regions. These shallow trench isolation structures are typically formed by etching trenches within the semiconductor substrate in a pattern that achieves the desired isolation between adjoining device regions. The trenches are filled with dielectric material. A chemical mechanical polishing process is then performed to form a dielectric plug that fills the trench.

In conventional shallow trench isolation processes, the chemical mechanical polishing process results in "dishing" of the dielectric plug. More particularly, the chemical mechanical polishing process results in a top surface of the plug that is not planar. Instead, the top surface of the plug is recessed in a concave pattern with respect to the top surface of rest of the substrate.

Because the top surface of the semiconductor substrate is not planar as a result of dishing during chemical mechanical polishing, layers and structures that are subsequently formed over the semiconductor substrate are not uniform. This leads to manufacturing problems and device failure.

What is needed is a method and apparatus that produces shallow trench isolation structures that are planar. In addition, a method and apparatus is needed that eliminates or reduces dishing of dielectric material that results from chemical mechanical polishing of shallow trench isolation structures. The method and apparatus of the present invention provides a solution to the above needs.

SUMMARY OF THE INVENTION

The present invention provides a method and apparatus that reduces dishing of dielectric material that results from chemical mechanical polishing of shallow trench isolation structures. Also, the method and apparatus of the present invention provides for forming shallow trench isolation structures that are planar.

A method for shallow trench isolation is disclosed that forms a shallow trench isolation structure having a planar top surface. First, a layer of silicon nitride (SiN) is deposited over a semiconductor substrate. A layer of polysilicon is then deposited over the silicon nitride layer. A layer of tetraethylorthosilicate (TEOS) is deposited over the polysilicon layer.

Mask and etch steps are performed to form an opening that extends through the TEOS layer and through the polysilicon layer. An etch step is then performed to etch the exposed side surfaces of the polysilicon layer. In the present embodiment, the etch step is a selective etch that selectively etches polysilicon. Thereby, the exposed side surfaces of the polysilicon layer are moved laterally.

An etch step is then performed so as to form a trench that extends into the semiconductor substrate. Optionally, an oxidation step and a TEOS removal step can be performed. The optional oxidation step repairs damage caused by the trench etch step. The optional TEOS removal step removes the TEOS layer.

Dielectric material is deposited such that the dielectric material fills the trench and fills the opening that extends through the polysilicon layer and the silicon nitride layer. In the present embodiment, silicon dioxide is used as a dielectric material and a high-density plasma deposition process is used to deposit the silicon dioxide. Because the selective etch moves the side surfaces of the polysilicon layer laterally, the deposited dielectric material extends past the edges of the trench. Thus, the dielectric material overlies the silicon nitride layer near the edges of the trench.

The substrate is then polished using a chemical mechanical polishing process. The chemical mechanical polishing step removes the polysilicon layer and forms a plug of dielectric material that fills the trench. In the present embodiment, a silica-based slurry is used. Because polysilicon has a higher removal rate as compared to silicon dioxide under normal silica-based slurry chemical mechanical polishing processes, a hump will develop within the top surface of the silicon dioxide. As the chemical mechanical polishing process progresses, the hump acts as a cushion in reducing the dishing of silicon dioxide. Thereby, the chemical mechanical polishing process produces a plug of dielectric material that has a top surface that is planar with respect to the top of the silicon nitride layer. More particularly, the top surface is only slightly recessed, if recessed at all, as a result of dishing caused by the chemical mechanical polishing process.

Because the top surface of the semiconductor substrate is planar as a result of elimination or minimization of dishing during chemical mechanical polishing, the method and apparatus of the present invention provides a superior shallow trench isolation structure as compared to prior art shallow trench isolation structures having significant dishing. Therefore, the method and apparatus of the present invention allows for formation of overlying layers and structures that are more uniform than those formed over prior art shallow trench isolation structures having significant dishing. Thus;, the present invention provides manufacturability and yield improvements as compared to prior art processes.

These and other objects and advantages of the present invention will become obvious to those of ordinary skill in the art after having read the following detailed description of the preferred embodiments that are illustrated in the various drawing figures.

DETAILED DESCRIPTION OF THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Figure 1:
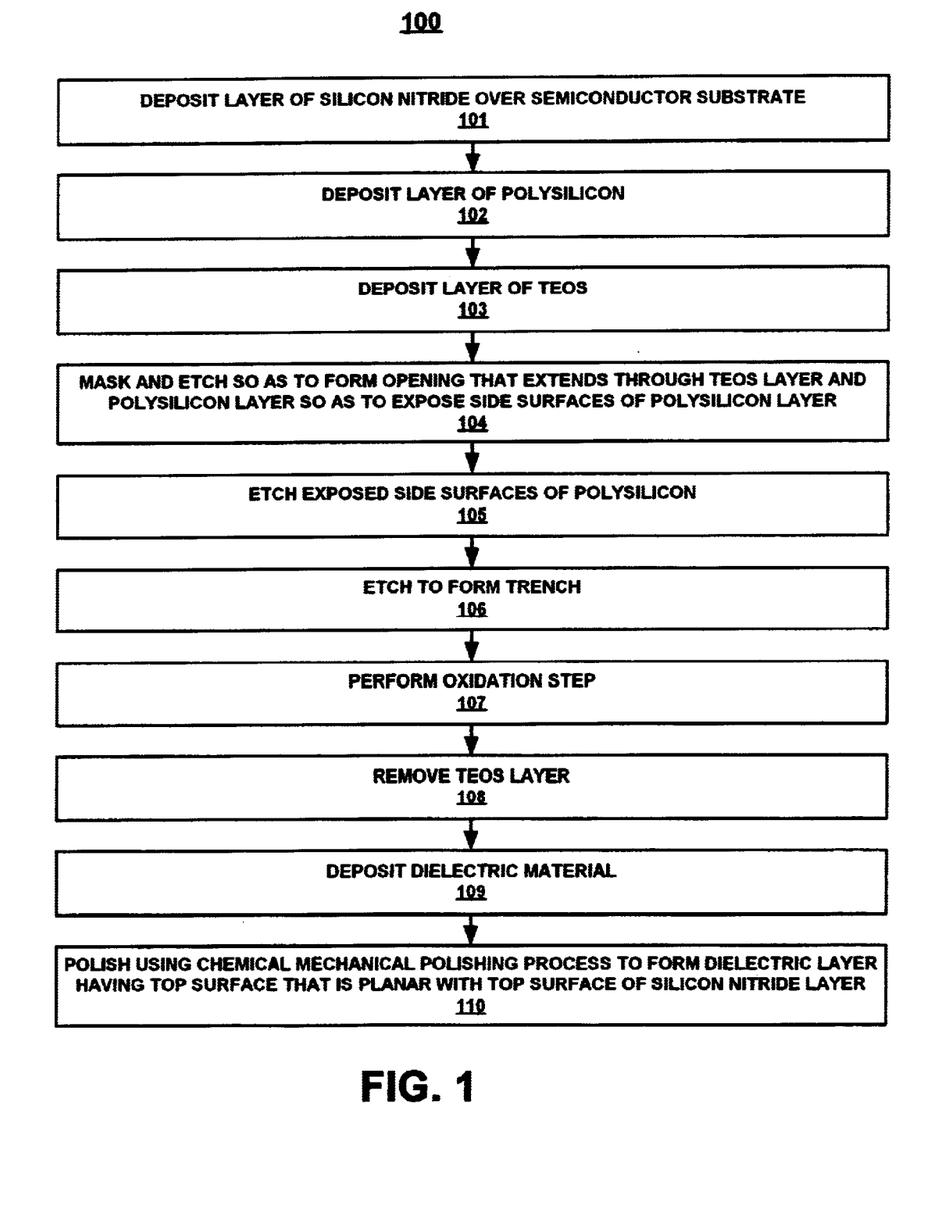
FIG. 1 shows a method for shallow trench isolation in accordance with one embodiment of the present invention.
Figure 2:
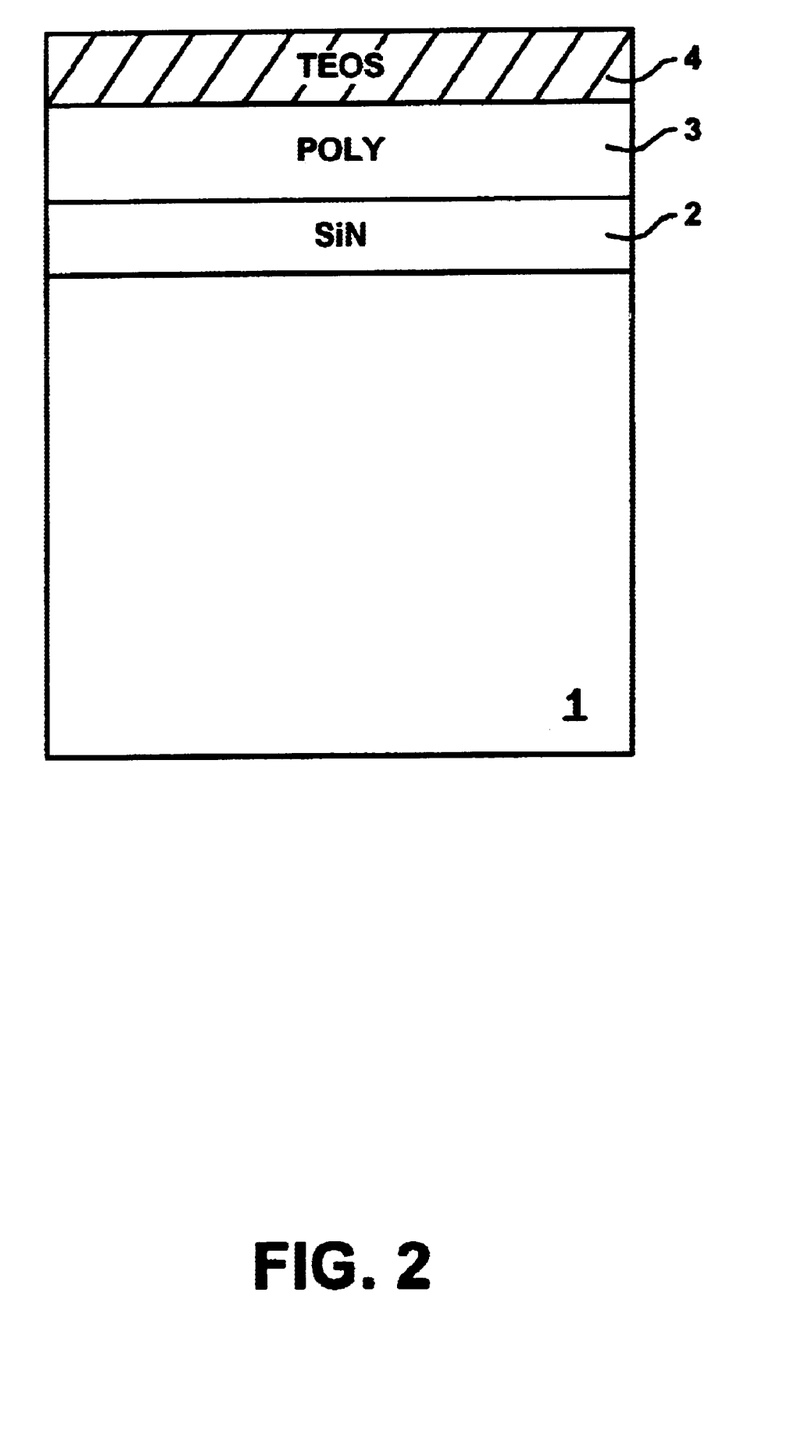
FIG. 2 is a side cut-away view of a semiconductor substrate having a layer of silicon nitride, a layer of polysilicon and a layer of TEOS deposited thereover in accordance with one embodiment of the present invention.

FIG. 1 illustrates a method for shallow trench isolation in accordance with one embodiment of the present invention. As shown by step 101, a layer of silicon nitride (SiN) is deposited over a semiconductor substrate. In the present embodiment, the layer of silicon nitride is deposited directly over the semiconductor substrate. In one embodiment, a layer of silicon nitride is deposited having a thickness of from 1000 to 1500 Angstroms.

A layer of polysilicon is then deposited as shown by step 102. In the present embodiment, the layer of polysilicon is deposited directly over the silicon nitride layer. In one embodiment, a layer of polysilicon is deposited having a thickness of from 900 to 1500 Angstroms.

As shown by step 103, a layer of tetraethylorthosilicate (TEOS) is deposited. In the present embodiment, the layer of TEOS directly overlies the polysilicon layer. In one embodiment, a layer of TEOS is deposited having a thickness of from 1000 to 1500 Angstroms.

FIGS. 2–11 show an exemplary semiconductor substrate 1 after steps 101–103 of FIG. 1 have been performed so as to form layer of silicon nitride (SiN) 2, layer of polysilicon (POLY) 3, and layer of TEOS 4. It can be seen that, in the present embodiment, the layer of silicon nitride directly overlies the semiconductor substrate and the layer of polysilicon directly overlies the layer of silicon nitride. The layer of TEOS directly overlies the layer of polysilicon. However, the present invention is well adapted for the use of other structures and materials including other layers that can be disposed between layers 2–4.

Figure 3:
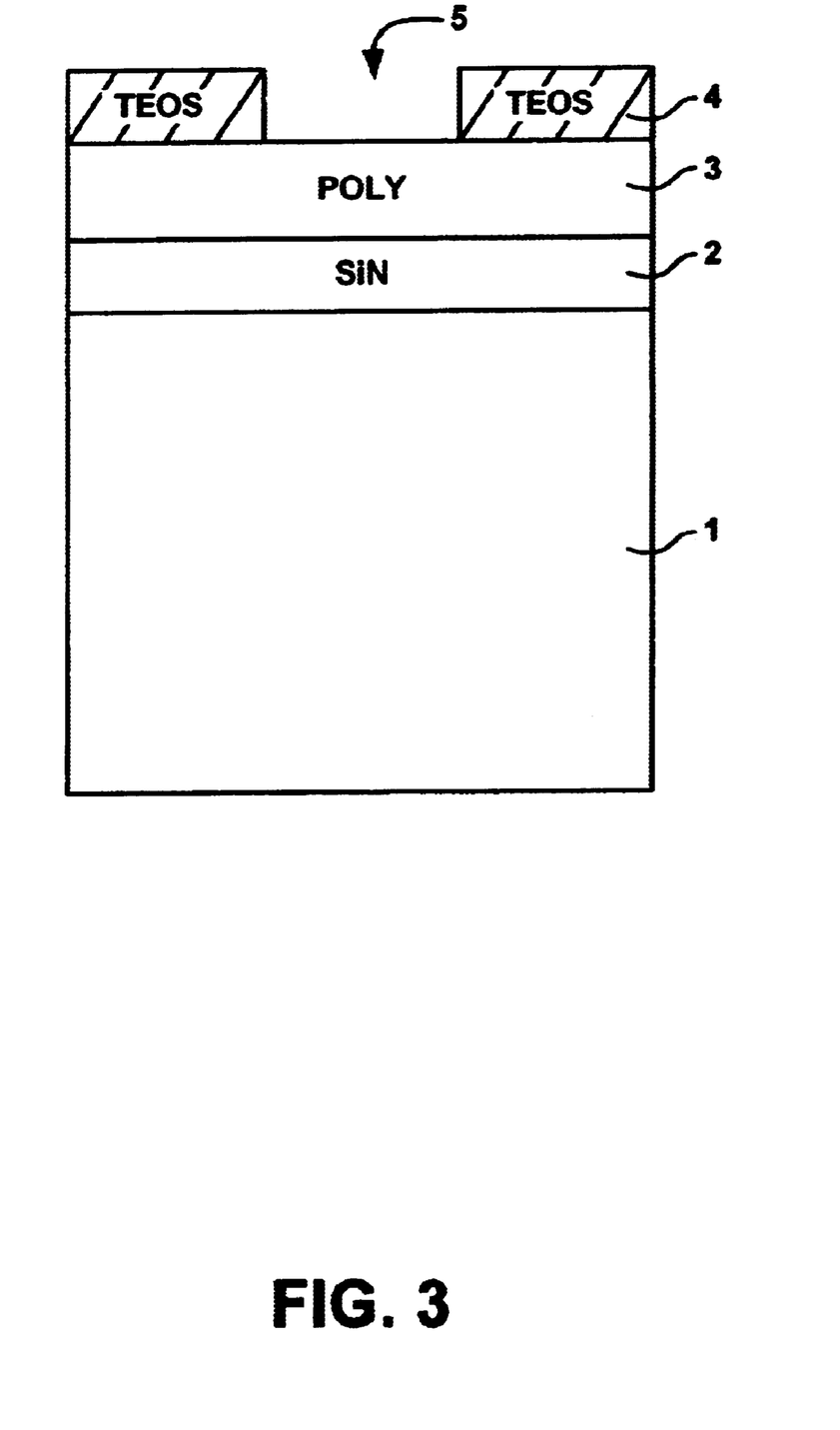
FIG. 3 is a diagram that illustrates the structure of FIG. 2 after mask and etch steps have etched through the TEOS layer in accordance with one embodiment of the present invention.

Mask and etch steps are performed as shown by step 104. In the present embodiment mask and etch steps form an opening that extends through the TEOS layer and through the polysilicon layer. In the present embodiment, a layer of photoresist (not shown) is formed over TEOS layer 4 and is exposed so as to form a desired shallow trench isolation pattern. The photoresist is then etched during a first etch so as to remove portions of TEOS layer 4 in the desired pattern. In one embodiment, a wet etch process is used to etch TEOS layer 4. FIG. 3 shows the structure of FIG. 2 after mask and etch steps have etched opening 5 that extends through TEOS layer 4.

Continuing with step 104, in the present embodiment, the photoresist is removed and a second etch is performed so as to etch through the polysilicon layer. In the present embodiment the second etch is a selective etch that selectively removes polysilicon. Thus, the overlying TEOS layer acts as a mask for etching the polysilicon layer in the same pattern as that of the TEOS layer and the silicon nitride layer acts as an etch stop. In one embodiment, the second etch is a dry etch process for selectively removing polysilicon. In the embodiment shown in FIG. 4 mask and etch step 104 is shown to have etched through both TEOS layer 4 and polysilicon layer 3 so as to form opening 5. Thereby, side surfaces 6 of polysilicon layer 3 are exposed.

Figure 4:
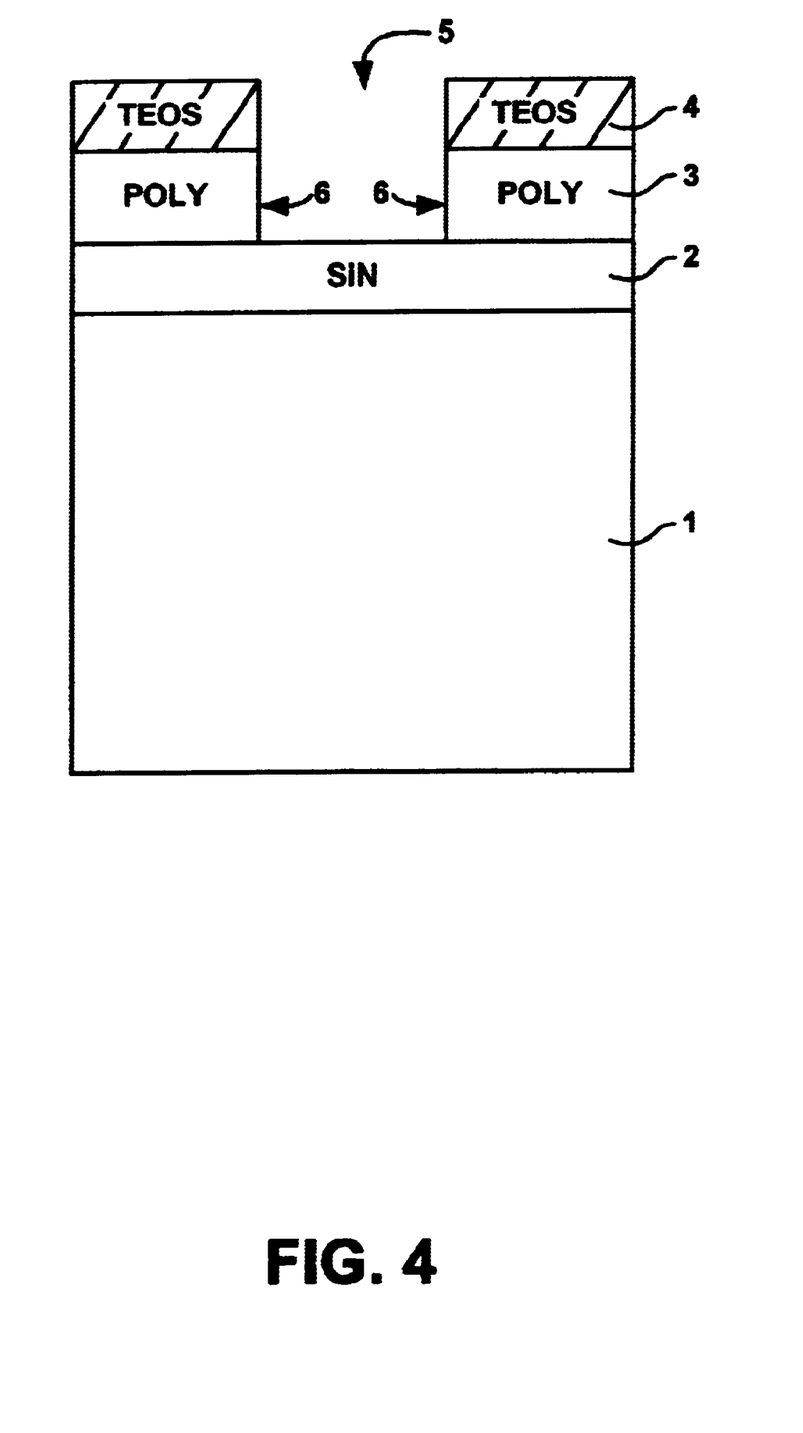
FIG. 4 is a diagram that illustrates the structure of FIG. 3 after an etch step has etched through the polysilicon layer in accordance with one embodiment of the present invention.

Referring now to step 105 of FIG. 1, an etch is performed to etch the exposed side surfaces of the polysilicon layer. In the present embodiment, the etch of step 105 is a selective etch that selectively etches polysilicon. More particularly, the polysilicon is etched while little or no TEOS or silicon nitride is removed. In one embodiment, etch step 105 is a wet etch in which the structure of FIG. 4 is dipped into a potassium hydroxide etchant solution. However, alternatively, other etchants could be used for selectively etching the exposed side surfaces of the polysilicon layer.

Figure 5:
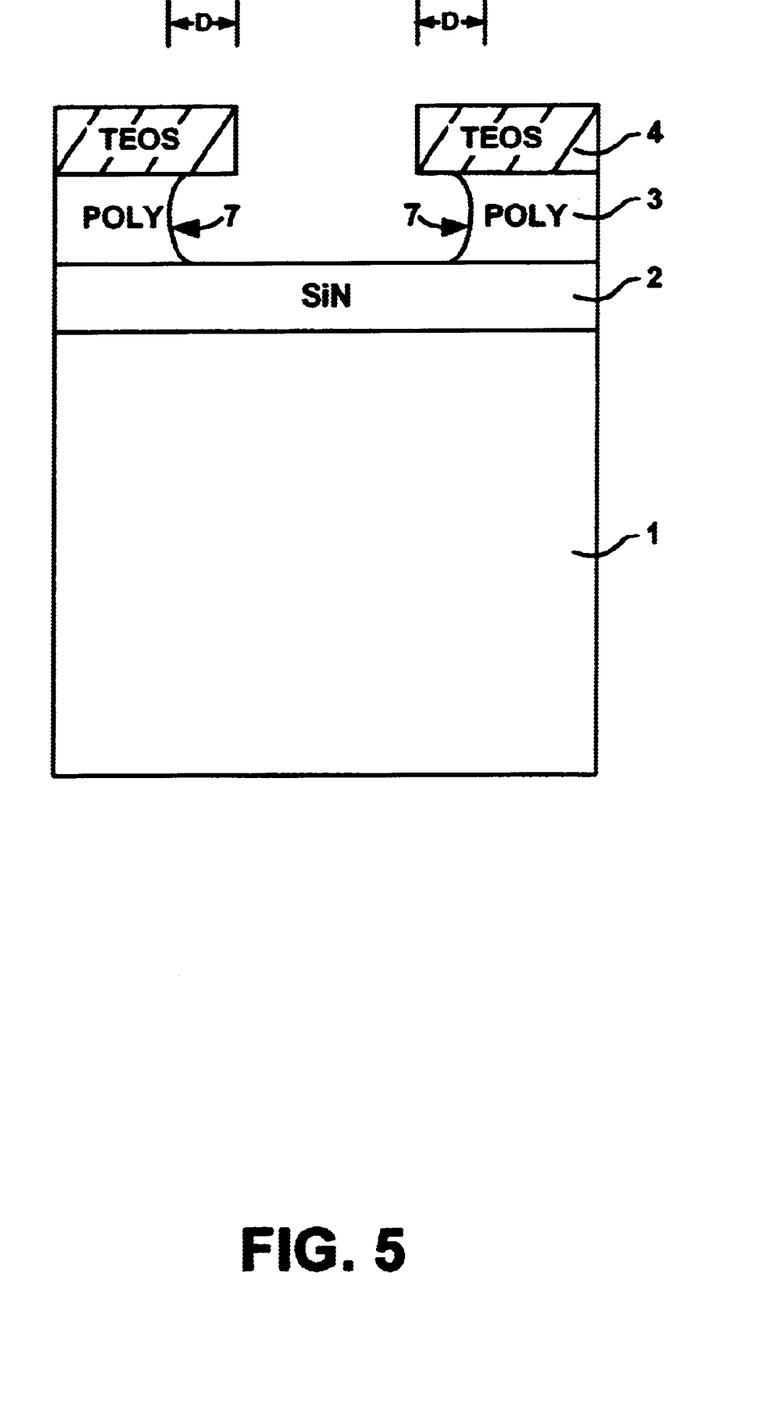
FIG. 5 is a diagram of the structure of FIG. 4 after a selective etch step has been performed so as to etch the exposed side surfaces of the polysilicon layer in accordance with one embodiment of the present invention.
Figure 6:
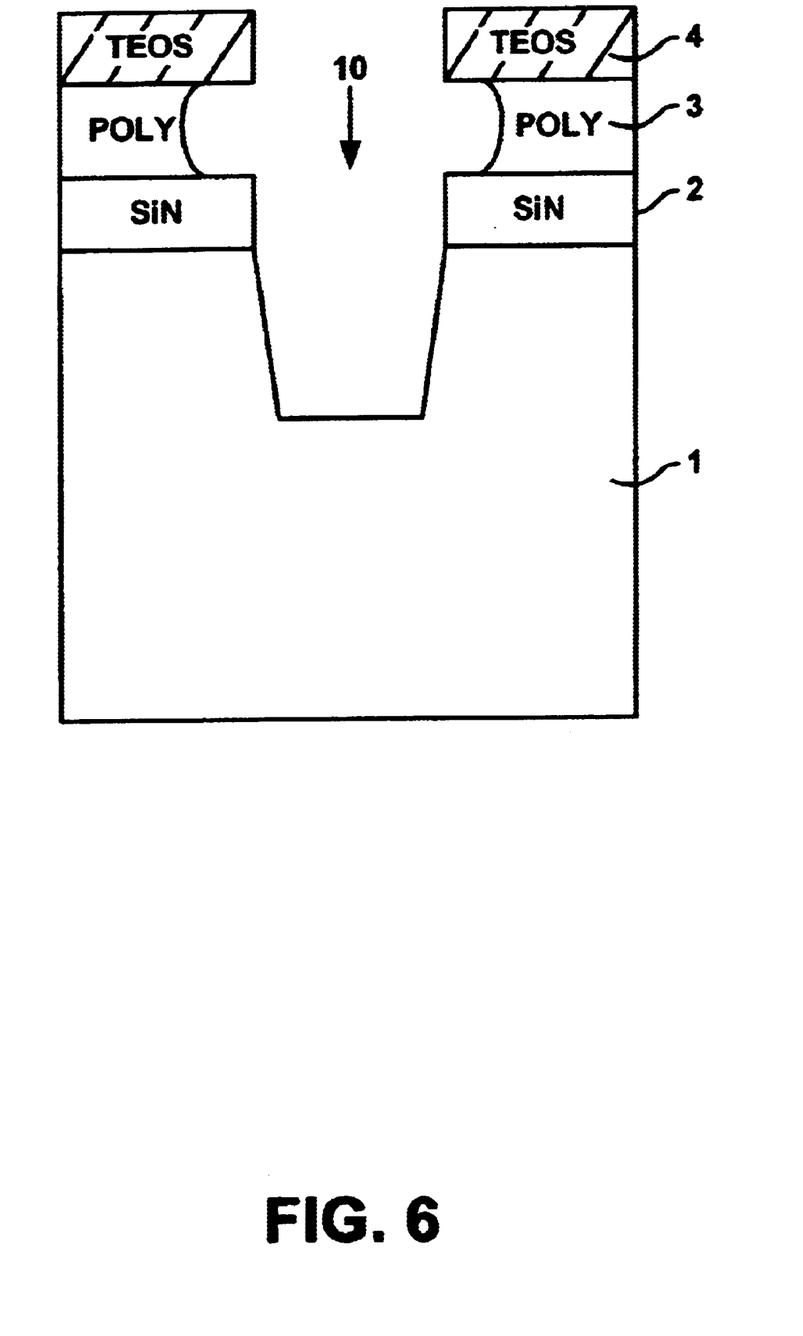
FIG. 6 is a diagram of the structure of FIG. 5 after an etch step has been performed so as to form a trench in accordance with one embodiment of the present invention.

FIG. 5 shows the structure of FIG. 4 after step 105 has been performed so as to etch polysilicon layer 3, forming side surfaces 7. It can be seen that side surfaces 7 are moved laterally with respect to side surfaces 6 of FIG. 4 a distance D.

Referring back to FIG. 1, an etch step is performed as shown by block 106 so as to form a trench. In the present embodiment, a dry etch is used to form a trench. In the embodiment shown in FIG. 6, etch step 106 is shown to form trench 10 that extends into semiconductor substrate 1.

An oxidation step is performed as shown by step 107. In the embodiment shown in FIG. 7, oxidation step 107 oxidizes the exposed surfaces of trench 10 and oxidizes side surfaces 7 so as to form a thin layer of oxide 11. Thin layer of oxide 11 acts to repair damage along the edges of polysilicon layer 3 and trench 10 resulting from etch step 106.

A TEOS removal step is performed as shown by step 108 to remove the TEOS layer. In the present embodiment, hydrofluoric acid is used to remove the TEOS layer. FIG. 8 shows the structure of FIG. 7 after TEOS removal step 108 has removed TEOS layer 4 shown in FIGS. 2–7.

Dielectric material is deposited as shown by step 109 of FIG. 1. In the present embodiment, silicon dioxide is used as a dielectric material and a high-density plasma deposition process is used to deposit the silicon dioxide.

Figure 8:
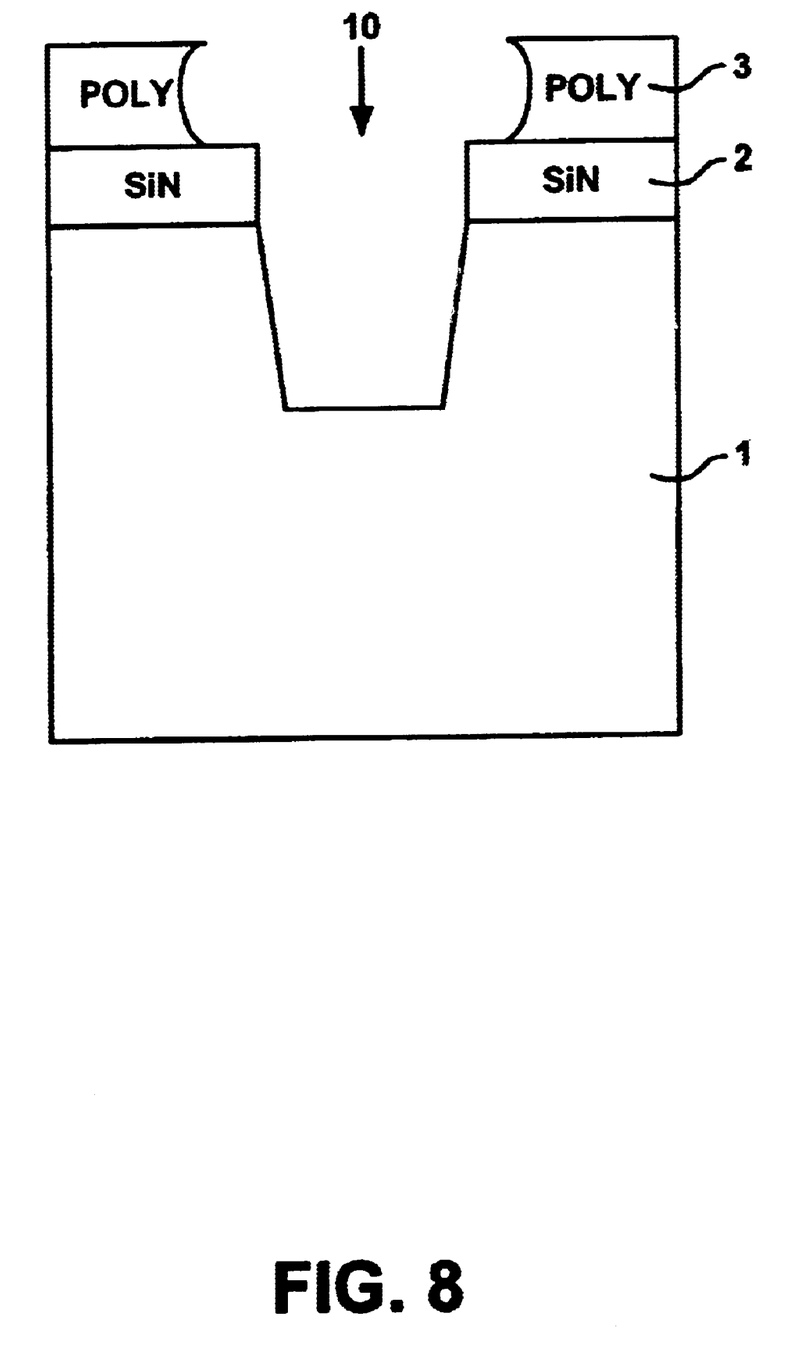
FIG. 8 is a diagram of the structure of FIG. 7 after a TEOS removal step has been performed in accordance with one embodiment of the present invention.
Figure 9:
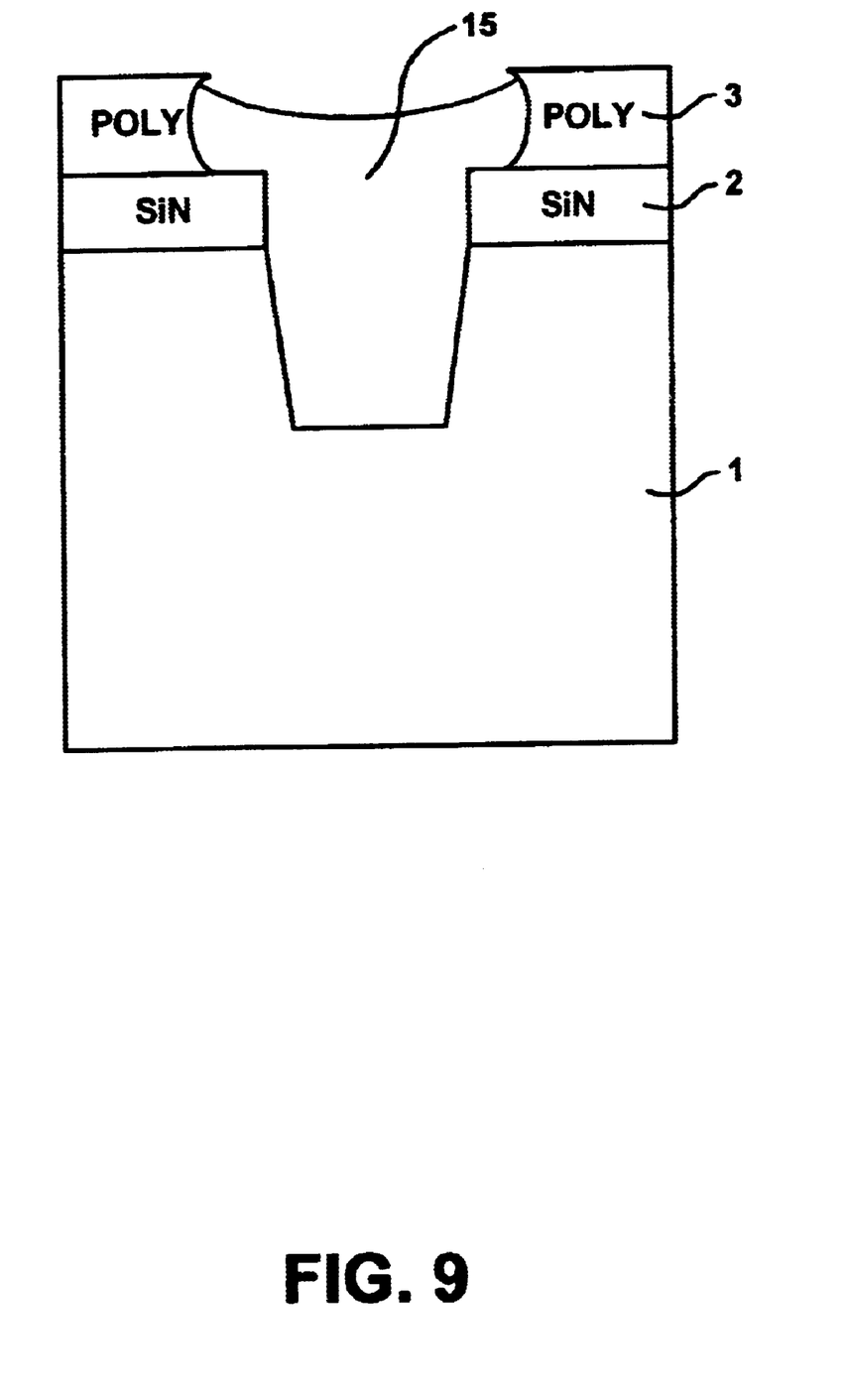
FIG. 9 is a diagram of the structure of FIG. 8 after a dielectric deposition step has been performed so as to fill the trench and the opening in the polysilicon layer in accordance with one embodiment of the present invention.

FIG. 9 shows the structure of FIG. 8 after step 109 has deposited dielectric material 15. It can be seen that dielectric material 15 fills trench 10. In addition, dielectric material 15 fills the opening that extends through polysilicon layer 3 and the opening that extends through silicon nitride layer 2.

Figure 10:
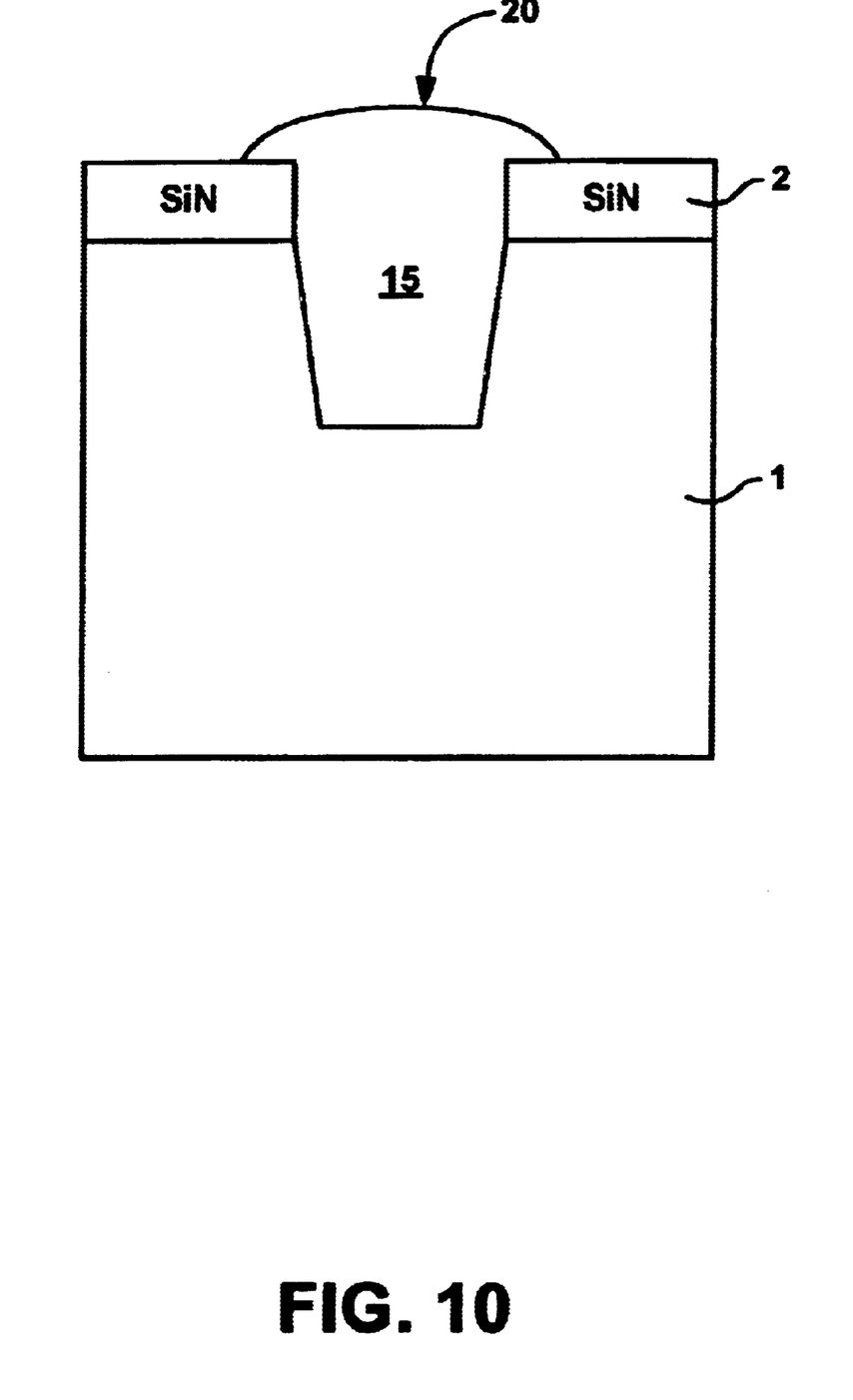
FIG. 10 is a diagram of the structure of FIG. 9 during the chemical mechanical polishing process in accordance with one embodiment of the present invention.

The substrate is polished as shown by step 109. In the present embodiment, the substrate is polished using a chemical mechanical polishing process. Referring now to FIG. 10, the chemical mechanical polishing step 109 removes polysilicon layer 3 shown in FIGS. 2–9 and forms a top surface 20 that extends past the sides of trench 10.

As a result of the extension of dielectric material 15 past the edges of the trench prior to beginning the chemical mechanical polishing process, dishing of dielectric during the chemical polishing process is minimized. More particularly, due to the different removal rate between polysilicon layer 3 and the oxide material of dielectric material 15, an oxide hump or protrusion develops across the trench that is illustrated in FIG. 10. This hump is useful as it acts as a cushion during the chemical mechanical polishing process. Thereby the oxide dishing effect is reduced, giving a planar top surface.

Figure 11:
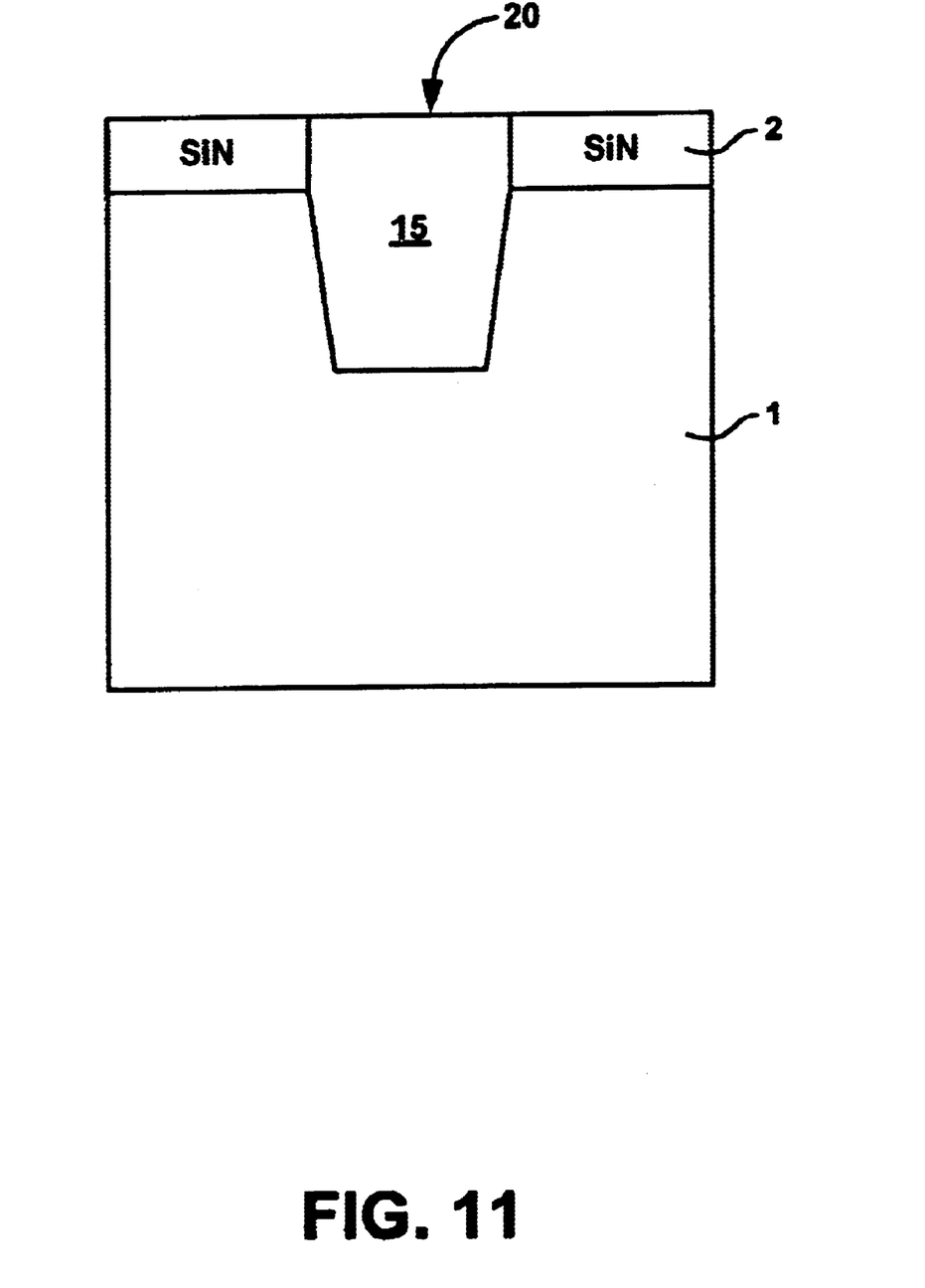
FIG. 11 is a diagram of the structure of FIG. 10 after completion of the chemical mechanical polishing process in accordance with one embodiment of the present invention.

FIG. 11 shows the structure of FIG. 10 after the chemical mechanical polishing process has been completed. Upon completion of the chemical mechanical polishing process as shown in FIG. 11, the top surface 20 of dielectric material 15 is planar with respect to the top of silicon nitride layer 2. More particularly, the top surface is only slightly recessed, if recessed at all, with respect to the top surface of silicon nitride layer 2.

The methods of the present invention have been found to form shallow trench isolation structures having a protrusion of 2.1 nanometers or for edge die and protrusion of approximately 3 nanometers for center die (when the chemical mechanical polishing process removes approximately 59 Angstroms of the silicon nitride layer). When 124 Angstroms of the silicon nitride layer is removed during the chemical mechanical polishing process, shallow trench isolation structures are formed having recesses of approximately 0.8 nanometer for center die and recesses of approximately 1.8 nanometers for edge die. When more polishing is performed so as to remove 260 Angstroms of the silicon nitride layer, shallow trench isolation structures are formed having recesses of approximately 4.8 nanometers for center die and recesses of approximately 5.2 nanometers for edge die. When even more polishing is performed so as to remove 370 Angstroms of the silicon nitride layer, shallow trench isolation structures are formed having recesses of approximately 6.3 nanometers for center die and recesses of approximately 5.8 nanometers for edge die.

For purposes of the present invention, any surface having a deviation (recess or protrusion) of less than 6.5 nanometers is considered to be planar. Accordingly, even when as much as 370 Angstroms of silicon nitride layer are removed, the method and apparatus of the present invention produces a planar top surface.

Figure 7:
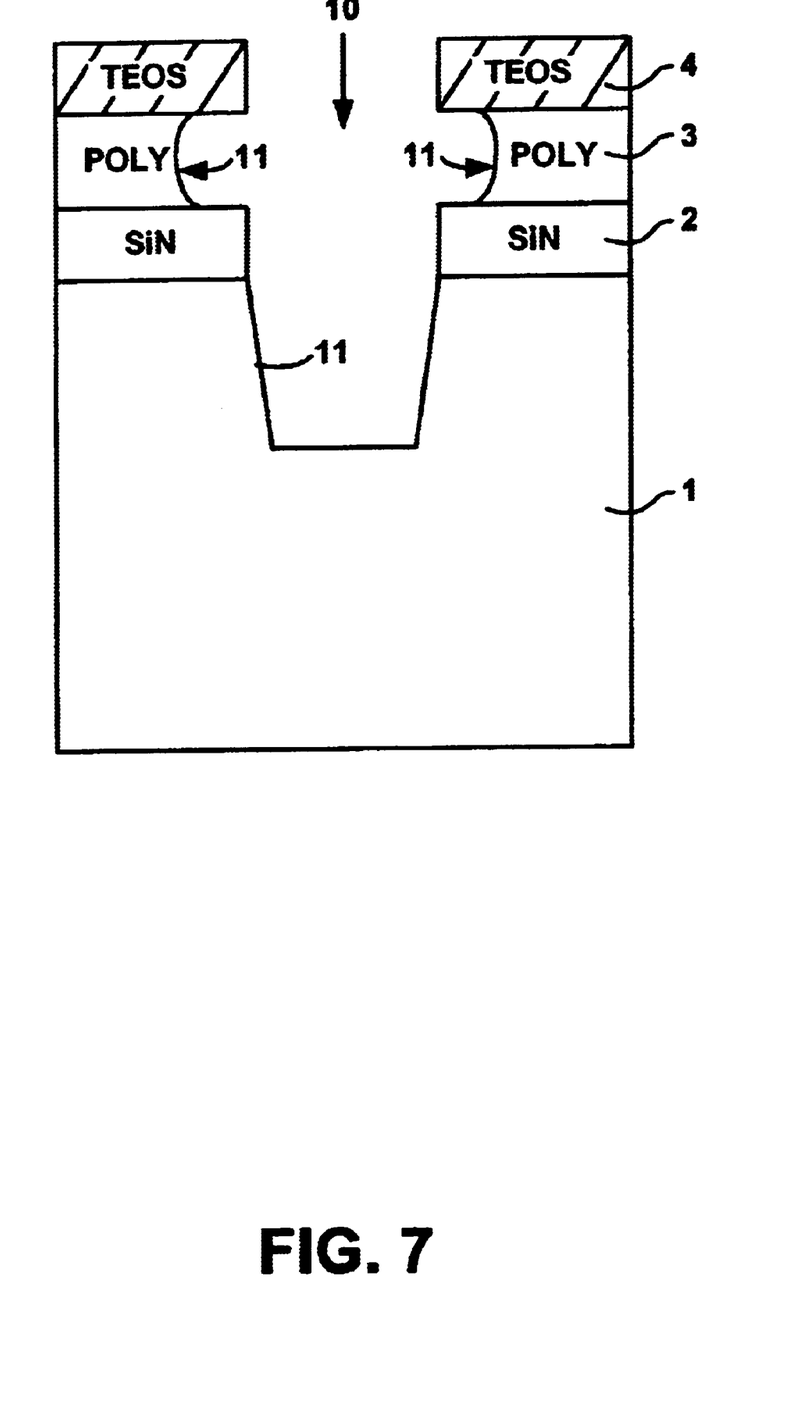
FIG. 7 is a diagram of the structure of FIG. 6 after an oxidation step has been performed in accordance with one embodiment of the present invention.

Though method 100 of FIG. 1 and FIG. 7 show an oxidation step 107 to be performed, oxidation step 107 (liner oxidation) is optional. Also, TEOS removal step 108 is optional. When TEOS removal step 108 is not performed, the chemical mechanical polishing process of step 110 is used to remove the TEOS layer.

Because the top surface of the semiconductor substrate is planar as a result of elimination of all, or at least substantially of the dishing during chemical mechanical polishing, the method and apparatus of the present invention provides a superior shallow trench isolation structure as compared to prior art shallow trench isolation structures having significant dishing. Therefore, the method and apparatus of the present invention allows for formation of overlying layers and structures that are more uniform than those formed over prior art shallow trench isolation structures having significant dishing. Thus, the present invention provides manufacturability and yield improvements as compared to prior art processes.

The foregoing descriptions of specific embodiments of the present invention have been presented for the purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention. It is intended that the scope of the invention be defined by the Claims appended hereto and their equivalents.

What is claimed is:

1. A method for shallow trench isolation, said method comprising:

depositing a layer of polysilicon over a semiconductor substrate;

depositing a layer of tetraethylorthosilicate over said layer of polysilicon;

etching said layer of tetraethylorthosilicate and said layer of polysilicon such that an opening is formed that extends through said layer of tetraethylorthosilicate and said layer of polysilicon, said opening exposing side surfaces of said layer of polysilicon;

etching said side surfaces of said layer of polysilicon such that said side surfaces are extended laterally; and wherein, upon subsequently forming a trench beneath said opening, and subsequently depositing dielectric material such that said dielectric material fills said opening and fills said trench, said lateral extension of said side surfaces reducing dishing of said dielectric material during chemical mechanical polishing of said dielectric material.

2. A method for shallow trench isolation as recited in claim 1 further comprising:

removing said layer of tetraethylorthosilicate prior to depositing dielectric over said semiconductor substrate.

3. A method for shallow trench isolation as recited in claim 2 wherein said layer of tetraethylorthosilicate has a thickness of between 1000 and 1500 Angstroms.

4. A method for shallow trench isolation as recited in claim 3 wherein said polysilicon layer has a thickness of between 900 and 1500 Angstroms.

5. A method for shallow trench isolation as recited in claim 1 wherein said step of etching said side surfaces of said layer of polysilicon further comprises dipping said semiconductor substrate in a potassium hydroxide etchant solution.

6. A method for shallow trench isolation comprising:

depositing a layer of silicon nitride over a semiconductor substrate;

depositing a layer of polysilicon over said layer of silicon nitride;

depositing a layer of tetraethylorthosilicate over said layer of polysilicon;

etching said layer of tetraethylorthosilicate and said layer of polysilicon such that an opening is formed that extends through said layer of tetraethylorthosilicate and said layer of polysilicon, said opening exposing side surfaces of said layer of polysilicon;

etching said side surfaces of said layer of polysilicon;

performing a dry etch step so as to form a trench within said semiconductor substrate, said trench isolating regions of said semiconductor substrate;

depositing dielectric material over said semiconductor substrate, said dielectric filling said trench; and polishing said substrate so as to form a structure that includes a top surface of said dielectric material, said top surface of said dielectric material having reduced dishing.

7. A method for shallow trench isolation as recited in claim 6 wherein depositing dielectric over said semiconductor substrate further comprises depositing silicon dioxide over said semiconductor substrate.

8. A method for shallow trench isolation as recited in claim 7 further comprising:

removing said layer of tetraethylorthosilicate prior to depositing dielectric over said semiconductor substrate.

9. A method for shallow trench isolation as recited in claim 8 wherein said layer of tetraethylorthosilicate has a thickness of between 1000 and 1500 Angstroms.

10. A method for shallow trench isolation as recited in claim 9 wherein aid polysilicon layer has a thickness of between 900 and 1500 Angstroms.

11. A method for shallow trench isolation as recited in claim 6 wherein said step of polishing said substrate further comprises performing a chemical mechanical polishing process so as to form a dielectric plug having a planar top surface.

12. A method for shallow trench isolation as recited in claim 6 wherein said step of polishing said substrate further comprises performing a chemical mechanical polishing process so as to remove said polysilicon layer, thereby forming a dielectric plug that fills said trench and that has a planar top surface.

13. A method for shallow trench isolation as recited in claim 12 wherein said step of etching said side surfaces of said layer of polysilicon further comprises dipping said semiconductor substrate in a potassium hydroxide etchant solution.

14. A method for shallow trench isolation as recited in claim 11 further comprising:

depositing a layer of polysilicon prior to etching said silicon nitride layer and said substrate so as to form a trench.

15. A method for shallow trench isolation as recited in claim 14 further comprising:

performing an oxidation step prior to said step of depositing dielectric over said semiconductor substrate.

* * * * *